(12) United States Patent
Maciejewski et al.

(10) Patent No.: US 6,980,009 B2
(45) Date of Patent: Dec. 27, 2005

(54) STRUCTURE FOR MEASUREMENT OF CAPACITANCE OF ULTRA-THIN DIELECTRICS

(75) Inventors: Edward P. Maciejewski, Wappingers Falls, NY (US); Phung T. Nguyen, Pleasant Valley, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 10/605,732

(22) Filed: Oct. 22, 2003

(65) Prior Publication Data

US 2005/0088186 A1   Apr. 28, 2005

(51) Int. Cl.[7] ............................................ G01R 27/26
(52) U.S. Cl. .................. 324/671; 324/658; 324/663; 324/681; 324/765
(58) Field of Search ............................... 324/671, 769, 324/681, 658, 763–766

(56) References Cited

U.S. PATENT DOCUMENTS

| | | | |
|---|---|---|---|
| 4,795,964 A * | 1/1989 | Mahant-Shetti et al. .... | 324/681 |
| 6,133,746 A | 10/2000 | Fang et al. | |
| 6,366,098 B1 * | 4/2002 | Froment ..................... | 324/678 |
| 6,404,222 B1 * | 6/2002 | Fan et al. .................... | 324/765 |
| 6,456,105 B1 | 9/2002 | Tao | |
| 6,472,233 B1 | 10/2002 | Ahmed et al. | |
| 6,476,632 B1 | 11/2002 | La Rosa et al. | |
| 6,541,986 B2 * | 4/2003 | Stein et al. .................. | 324/651 |
| 2004/0008051 A1 * | 1/2004 | Ohkawa et al. ............. | 324/765 |

OTHER PUBLICATIONS

"A Simple Method for On-Chip, Sub-Femto Farad Interconnect Capacitance Measurement", Bruce W. McGaughy, James C. Chen, Dennis Sylvester, Cheuming Hu, IEEE, vol. 18, No. 1, Jan. 1997, 1 page.

* cited by examiner

Primary Examiner—Anjan Deb
Assistant Examiner—M. Kramskaya
(74) Attorney, Agent, or Firm—McGinn & Gibb, PLLC; Anthony Canale

(57) ABSTRACT

Disclosed is an on-chip test device for testing the thickness of gate oxides in transistors. A ring oscillator provides a ring oscillator output and an inverter receives the ring oscillator output as an input. The inverter is coupled to a gate oxide and the inverter receives different voltages as power supplies. The difference between the voltages provides a measurement of capacitance of the gate oxide. The difference between the voltages is less than or equal to approximately one-third of the difference between a second set of voltages provided to the ring oscillator. The capacitance of the gate oxide comprises the inverse of the frequency of the ring oscillator output multiplied by the difference between the voltages, less a capacitance constant for the test device. This capacitance constant is for the test device alone, and does not include any part of the capacitance of the gate oxide. The measurement of capacitance of the gate oxide is used to determine the thickness of the gate oxide.

25 Claims, 3 Drawing Sheets

STRUCTURE FOR MEASUREMENT OF CAPACITANCE OF ULTRA-THIN DIELECTRICS

BACKGROUND OF INVENTION

1. Field of the Invention

The present invention generally relates to an on-chip test circuit for testing the gate oxide capacitance and more particularly to a circuit that includes a ring oscillator to allow high frequency testing.

2. Description of the Related Art

As integrated circuit transistors are reduced in size (e.g., scaled), gate dielectrics continue to get thinner. Gate dielectrics that have been scaled to very small values are experiencing an exponential increase in the incidence of undesirable tunneling currents, in which the gate dielectric fails to insulate the gate from the underlying substrate. In addition, the increased use of larger dielectric DC currents requires the use of higher frequency test devices when measuring capacitance in order for the displacement current to significantly exceed the DC leakage current.

For example, in 90 nm technology, the DC leakage has reached current densities on the order of 400 A/cm², requiring frequencies on the order of 100 Mhz for the displacement current to significantly exceed the DC leakage current. Ordinary test structures and test equipment are unable to perform such high-frequency measurements, making the characterization of gate oxide thickness a very difficult test, which is unable to be repeated in a manufacturing environment.

SUMMARY OF INVENTION

The invention provides an on-chip test device for testing the thickness of gate oxides in transistors. With the invention, a ring oscillator provides a ring oscillator output and an inverter receives the ring oscillator output as an input. The inverter is coupled to a gate oxide capacitor and the inverter receives different voltages as power supplies. The current drawn by the inverter provides a measurement of capacitance of the gate oxide. In a different embodiment, the invention comprises a plurality of inverters receiving the ring oscillator output to allow one of the terminals of a multi-terminal device to be tested. Current drawn by the inverters provides a measurement of capacitance of each of the devices under test.

The difference between the voltages supplied to the inverter is less than or equal to approximately one-third of the difference between a second set of voltages provided to the ring oscillator. Also, the difference between the voltages supplied to the inverter is less than the sum of the absolute values of the threshold voltages of the n-type and p-type FETs that make up the inverter.

The capacitance of the gate oxide is calculated by multiplying the frequency of the ring oscillator output by the difference between the voltages supplied to the inverter. The current drawn by the inverter is then divided by the result of this multiplication process. A capacitance constant for the test device is then subtracted from the result of this division process. This capacitance constant is for the test device alone, and does not include any part of the capacitance of the gate oxide capacitor. The measurement of capacitance of the gate oxide capacitor is used to determine the electrical thickness of the gate oxide through the well known relationship $Tinv=A\times\in_{ox}/C$, where A is the area of the gate oxide capacitor, C is the measured capacitance, and $\in_{ox}$ is the dielectric constant of the gate oxide.

In method form, the invention provides a method of testing the capacitance of a device under test in an integrated circuit chip. More specifically, this method supplies the output of the ring oscillator to the inverter to produce an inverted ring oscillator output. Again, the inverter receives different voltages as power supplies. The method also inputs the inverted ring oscillator output to the device under test. The current drawn by the inverter provides a measurement of capacitance of the device under test. Again, the difference between the voltages is less than or equal to approximately one-third of the difference between a second set of voltages provided to the ring oscillator and is also less than the sum of the absolute values of the threshold voltages of the n-type and p-type FETs that make up the inverter. The capacitance of the device under test is calculated by multiplying the frequency of the ring oscillator output by the difference between the voltages supplied to the inverter. The current drawn by the inverter is then divided by the result of this multiplication process. The capacitance constant for the test device is then subtracted from the result of this division process.

Thus, the invention uses an on-chip ring oscillator to provide a high-frequency signal together with a circuit which will allow measurement of the capacitance at very high frequencies using ordinary test probes and equipment. This circuit allows full C-V (capacitance-voltage) characterization, avoiding the weaknesses associated with the use of simple ring-oscillators as a means of capacitance extractions.

BRIEF DESCRIPTION OF DRAWINGS

The invention will be better understood from the following detailed description with reference to the drawings, in which.

DETAILED DESCRIPTION

As mentioned above, the increased use of larger dielectric DC currents requires the use of higher frequency test devices when measuring capacitance in order for the displacement current to significantly exceed the DC leakage current. The invention uses an on-chip ring oscillator to provide a high-frequency signal together with a circuit which will allow measurement of the capacitance at very high frequencies using ordinary test probes and equipment. This circuit allows full C-V characterization, avoiding the weaknesses associated with the use of simple ring-oscillators as a means of capacitance extractions.

Figure 1:
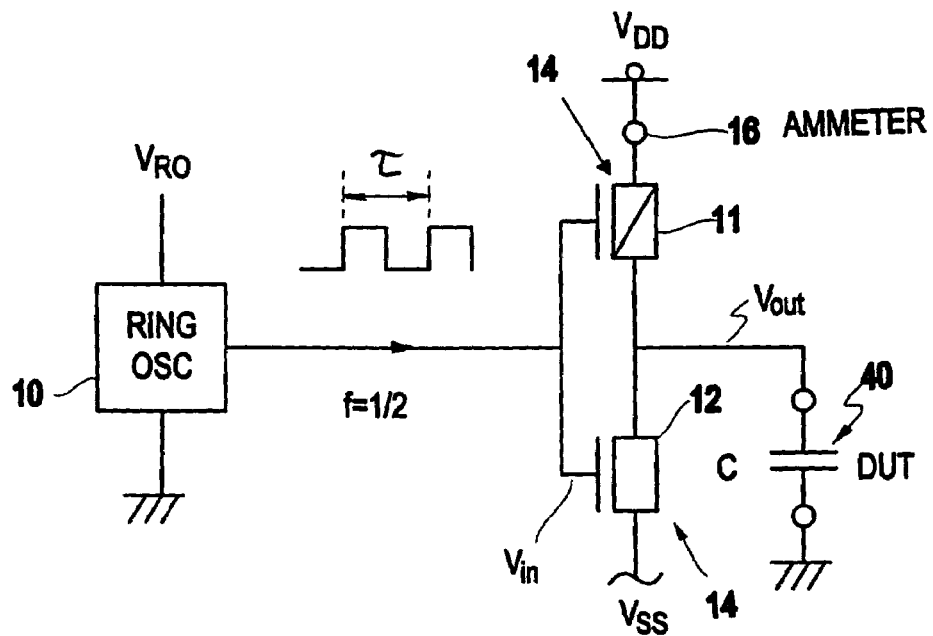
FIG. 1 is a schematic diagram of a circuit incorporating aspects of the invention.

FIG. 1 is a schematic diagram of one example of the invention embodied in the circuit used for on-chip high-frequency capacitance characterization. While the following embodiment is designed to find the capacitance of a device (such as an ultra-thin gate oxide), the invention can also be used to measure gate length, channel width, flat-band voltage, interconnect capacitance, etc.

The circuit shown in the example in FIG. 1 includes a ring oscillator 10 and an inverter 14 comprising an P-type transistor 11, and a N-type transistor 12. The oscillator 10 is connected to a different power supply ($V_{RO}$) than the inverter $V_{DD}$. The ring oscillator 10 is capable of producing a signal of very high frequency, f, above 100 Mhz (shown in the waveform in FIG. 1) with period "t". The device under test "DUT" (e.g., the capacitance of the gate oxide in this example) is shown as capacitor 40. Transistor 11 is connected to $V_{DD}$, while transistor 12 is connected to $V_{SS}$ and, $V_{SS}$ and $V_{DD}$ can be chosen ($V_{DD}$>$V_{SS}$) to limit the voltage range across the DUT 40 and thus, make the capacitance measurements at a specific DC bias voltage, which is usually required for complete characterization of the DUT. Furthermore $V_{DD}V_{SS}$ should be less than the sum of the absolute values of the threshold voltages of the n-type and p-type FETs that make up the inverter.

Figure 2:
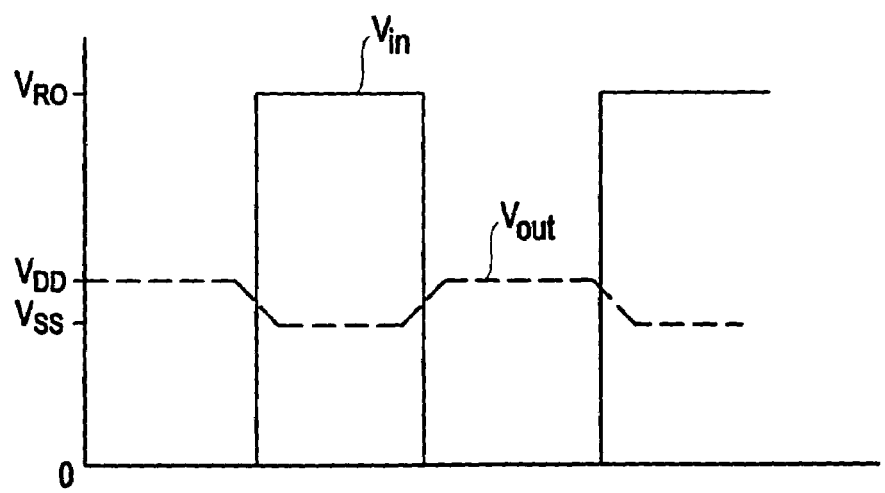
FIG. 2 is a waveform diagram illustrating the processing achieved with the invention.

FIG. 2 illustrates waveforms of the ring oscillator "RO" 10 (at $V_{IN}$) and to the DUT 14 ($V_{OUT}$). To measure the capacitance of the DUT 14, knowing that the current drawn in $V_{DD}$ (or $V_{SS}$) is $$I=(V_{DD}-V_{SS}) \times f \times (Cckt+C),$$

which is inverted to yield:

$$C=I/(f \times (V_{DD}-V_{SS}))-Cckt$$

where I is measured current at $V_{DD}$ using ammeter 16, $V_{DD}$ and $V_{SS}$ are the applied voltages to the circuit in FIG. 1, f is the frequency supplied to $V_{IN}$ (by the ring oscillator), and Cckt represents the incidental capacitance that the test circuit itself adds to the DUT node. To separate Cckt from C, the invention uses a second copy (e.g., a sample, non-testing, standards circuit) of the circuit that is not connected to a DUT to develop a constant for the capacitance of the test circuit Cckt alone. Then, as shown above, the invention simply substitutes this constant for Cckt in the above equation.

This is shown graphically in the waveform diagram in FIG. 2. More specifically, FIG. 2 shows that, at each pulse from the ring oscillator from 0 V to $V_{RO}$ at $V_{IN}$, the voltage at $V_{OUT}$ decreases from $V_{DD}$ to $V_{SS}$. The capacitance of the DUI is detected from the current drawn by the inverter, I, as shown by the above equation (e.g., I/($V_{DD}$-$V_{SS}$)).

Thus, as shown above, the invention provides an on-chip test device for testing the thickness of gate oxides in transistors. With the invention, a ring oscillator provides a ring oscillator output and an inverter receives the ring oscillator output as an input. The inverter is coupled to a gate oxide and the inverter receives different voltages as power supplies. The current drawn by the inverter together with the frequency of the signal and the difference between the voltages provides a measurement of capacitance of the gate oxide through the relationship above. The difference between the voltages is less than or equal to approximately one-third of the difference between a second set of voltages provided to the ring oscillator in order to represent a good approximation to the differential capacitance, dQ/dV, of the DUT. Furthermore, the difference between the voltages $V_{DD}$ and $V_{SS}$ should also be less than the sum of the absolute values of the threshold voltages of the n-type and p-type FETs which make up the inverter in order to ensure that no short-circuit current contributes to the inverter current.

The capacitance of the gate oxide capacitor (or other device being measured) comprises the current drawn by the inverter divided by a multiplication result of the frequency of the ring oscillator output multiplied by the difference between the voltages supplied to the inverter (less the capacitance constant for the testing structure). In other words, the capacitance of the device under test is calculated by multiplying the frequency of the ring oscillator output by the difference between the voltages supplied to the inverter. The current drawn by the inverter is then divided by the result of this multiplication process. The capacitance constant for the test device is then subtracted from the result of this division process. This capacitance constant is for the testing device alone, and does not include any part of the capacitance of the gate oxide capacitor. The measurement of capacitance of the gate oxide capacitor is used to determine the electrical thickness of the gate oxide.

Figure 3:
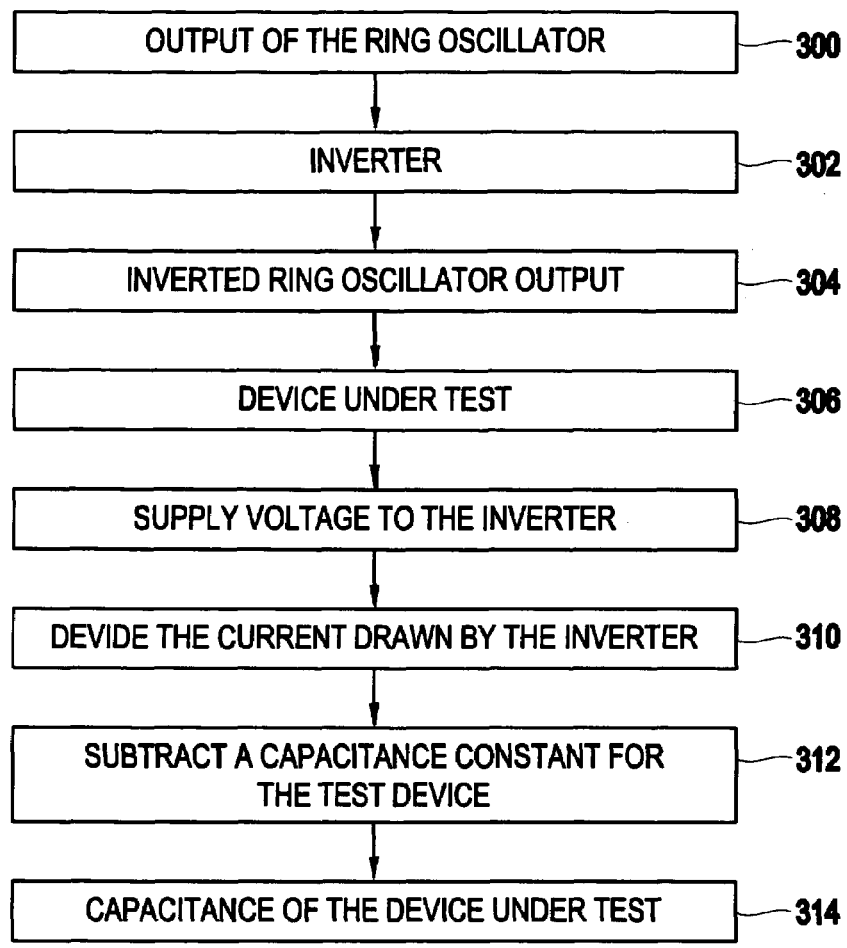
FIG. 3 is a flow diagram illustrating a preferred method of the invention.

FIG. 3 illustrates the inventive method of testing the capacitance of a device under test in an integrated circuit chip. More specifically, this method supplies the output of the ring oscillator 300 to the inverter 302 to produce an inverted ring oscillator output 304. Again, the inverter receives different voltages as power supplies. The method also inputs the inverted ring oscillator output to the device under test 306. The current drawn by the inverter provides a measurement of capacitance of the device under test. Again, the difference between the voltages is less than or equal to approximately one-third of the difference between a second set of voltages provided to the ring oscillator and furthermore is less than the sum of the absolute values of the threshold voltages of the n-type and p-type FETs which make up the inverter. The capacitance of the device under test 314 is calculated by multiplying the frequency of the ring oscillator output by the difference between the voltages supplied to the inverter (item 308). The current drawn by the inverter is then divided by the result of this multiplication process (item 310). The capacitance constant for the test device is then subtracted from the result of this division process (item 312) to produce the desired capacitance 314.

Figure 4:
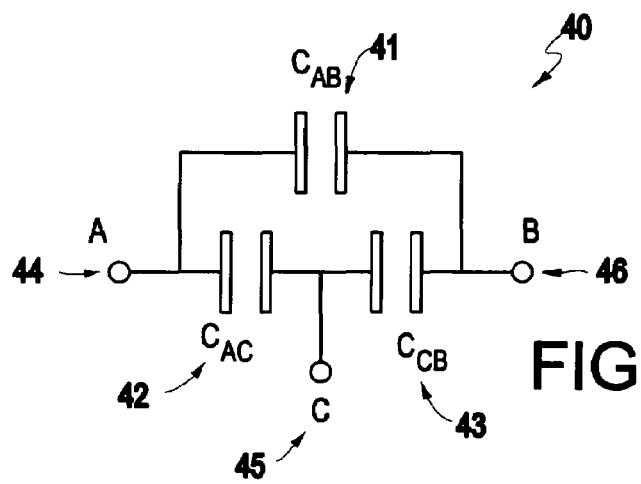
FIG. 4 is a schematic diagram of a circuit incorporating aspects of the invention.

Another embodiment of this invention (shown in FIGS. 4 and 5) provides for similar three-terminal measurement of capacitances. In many three terminal devices 40, a capacitance network 41-43 exists among all three nodes 44-46 (A-C), represented by the schematic diagram in FIG. 4. For example, it may be desirable to measure only the capacitance $C_{AB}$, directly between terminals A and B of FIG. 4. The invention as previously described, if applied to terminals A and B, will measure the combined capacitance of $C_{AB}$ added to the series capacitance combination of $C_{BC}$ and $C_{AB}$.

Figure 5:
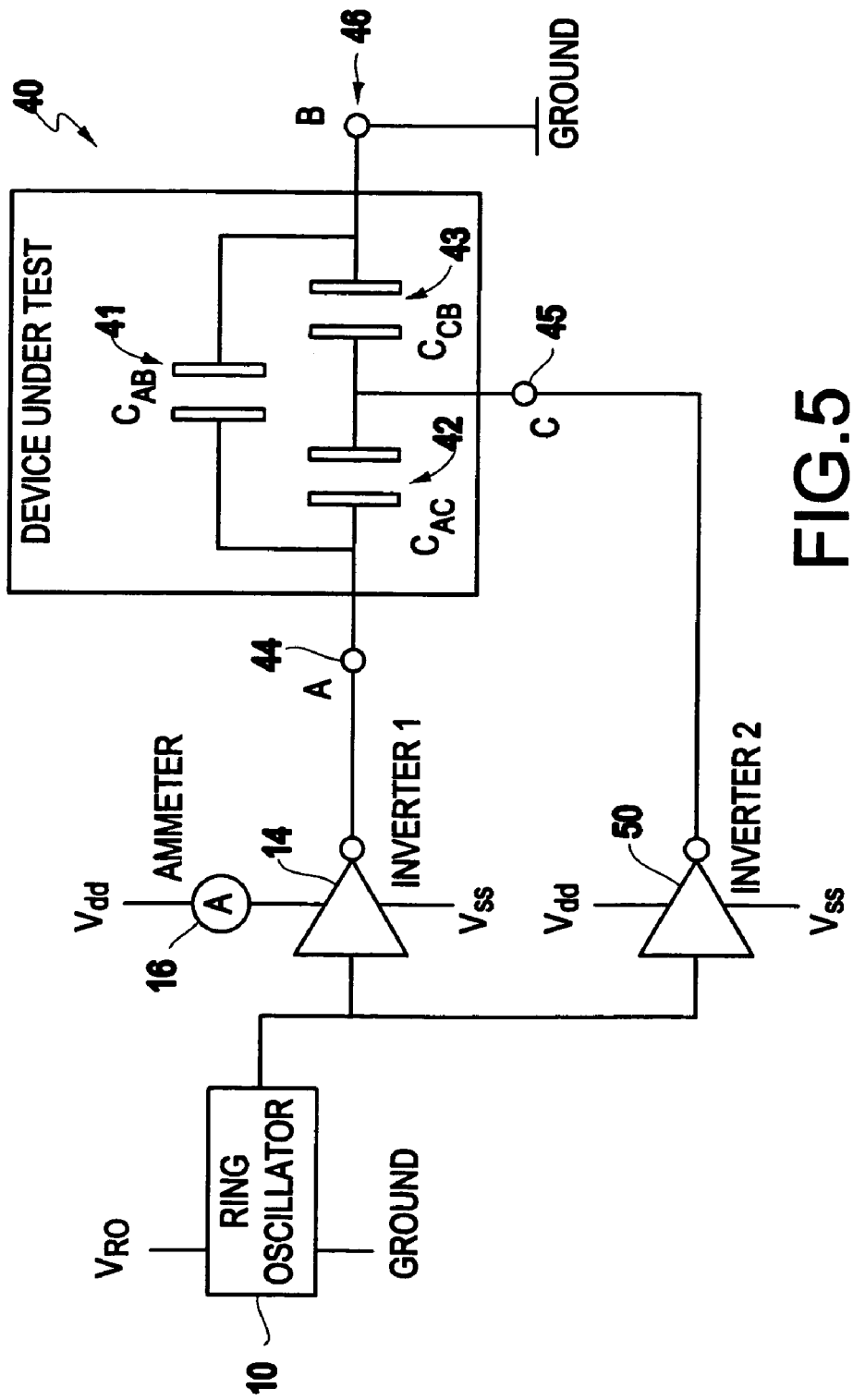
FIG. 5 is a schematic diagram of a circuit incorporating aspects of the invention.

To provide for this case, a second inverter 50 is added to the measurement structure of FIG. 1, as shown in FIG. 5. This second inverter 50 receives the same power supply voltages as the first inverter 14, however the signal from the second inverter is applied to the "third" terminal, terminal C in this example while terminal B is tied to ground. This allows the capacitance of $C_{AB}$ (capacitor 41) to be easily determined because neither capacitor 42 ($C_{AC}$) nor capacitor 43 ($C_{CB}$) will draw power from the first inverter 14 by operation of the connections to ground and the second inverter 50. Again the average (DC) current drawn by the first inverter 14, 1, is measured using ammeter 16 with $V_{DD}$ and $V_{SS}$ applied to the upper and lower inverter power supply terminals, respectively, and the output of the first inverter 14 applied to terminal A. As a result, the same signal voltage appears on terminals A and C, ensuring that neither capacitor 42 ($C_{AC}$) nor capacitor 43 ($C_{CB}$) will draw power from the first inverter 14. Thus, the current drawn by the first inverter 14 is used to determine the capacitance of capacitor 42. Because of this arrangement, the current drawn by one inverter provides a measurement of capacitance of one of the terminals while the remaining inverter(s) isolate the current drawn by the first inverter to only that associated with its terminal.

As in the first embodiment of this invention (shown in FIG. 1), the capacitance of the device under test, $C_{AB}$ 41, is given by $C_{AB}=(I/[f\times(V_{DD}-V_{SS})])\ C_{CKT}$, where f is the frequency of the ring oscillator, and $C_{CKT}$ is the capacitance of the test structure alone, measured with an identical structure to that of FIG. 5 except with no device under test, and $C_{CKT}$ is calculated by $C_{CKT}=I_{ZERO}/[f\times(V_{DD}-V_{SS})]$. $I_{ZERO}$ is the current measured in the inverter of the test structure with no device under test.

As mentioned above, the invention can be used for a number of purposes, such as determining gate length, $L_{GATE}$. More specifically, gate length may be measured in the same manner, by having a few copies of the inventive circuit, each with a MOSFET of fixed channel width and varying gate length. Then, the invention compares the gate capacitance vs $L_{DESIGN}$ (the design length of the gate of each MOSFET), which can be used to extract Lgate (gate length) in a well known manner. In particular, a linear relationship of $L_{DESIGN}$ versus measured gate capacitance is established through the preceding measurements, and the correlation used to extrapolate to a value of $L_{DESIGN}=\Delta L$, where the gate capacitance is equal to just the edge (or outer fringe) capacitance of the gate. This value $\Delta L$, gives the difference between the design length, $L_{DESIGN}$, and the physical gate length, $L_{GATE}$.

Therefore, as shown above, the invention uses an on-chip ring oscillator to provide a high-frequency signal together with a circuit which will allow measurement of the capacitance at very high frequencies using ordinary test probes and equipment. This circuit allows full C-V characterization, avoiding the weaknesses associated with the use of simple ring-oscillators as a means of capacitance extractions.

Advantages of this invention include the ability to perform in-line manufacturing measurements of capacitances with standard equipment. This results in low test costs, short test-time, and regular monitoring of critical manufacturing processes. As a result, improved manufacturing control ultra-thin oxide processes used to fabricate ICs is possible. Thinner dielectrics with high leakage values can be reliably characterized in line, allowing for fabrication of more-advanced structures.

While the invention has been described in terms of preferred embodiments, those skilled in the art will recognize that the invention can be practiced with modification within the spirit and scope of the appended claims.

What is claimed is:

1. A semiconductor structure formed on a substrate comprising:
    a ring oscillator receiving a first voltage and a second voltage as power supplies, wherein said ring oscillator outputs a ring oscillator output; and
    an inverter receiving said ring oscillator output as an input, said inverter being coupled to a device under test and said inverter receiving a third voltage and a fourth voltage as power supplies,
    wherein current drawn by said inverter provides a measurement of capacitance of said device under test,
    wherein a difference between said third and fourth voltages is less than or equal to approximately one-third of the difference between said first and second voltages.

2. The structure in claim 1, wherein a difference between said third and fourth is less than the sum of absolute values of threshold voltages of n-type and p-type field effect transistors that comprise said inverter.

3. The structure in claim 1, wherein said capacitance comprises:
    said current drawn by said inverter divided by a multiplication result of the frequency of said ring oscillator output multiplied by the difference between said third and fourth voltages; less
    a capacitance constant for said structure.

4. The structure in claim 3, wherein said capacitance constant is for said semiconductor structure alone and does not include any part of said capacitance of said device under test.

5. The structure in claim 1, wherein said measurement of capacitance of said device under test is used to determine the thickness of a gate oxide.

6. The structure in claim 1, wherein said device under test comprises one of a gate oxide capacitor, a gate conductor, a channel, and an interconnect.

7. An on-chip test device comprising:
    a ring oscillator receiving a first voltage and a second voltage as power supplies, wherein said ring oscillator outputs a ring oscillator output; and
    an inverter receiving said ring oscillator output as an input, said inverter being coupled to a device under test and said inverter receiving a third voltage and a fourth voltage as power supplies,
    wherein said on-chip test device and said device under test are located on the same semiconductor chip; and
    wherein current drawn by said inverter provides a measurement of capacitance of said device under test,
    wherein a difference between said third and fourth voltages is less than or equal to approximately one-third of the difference between said first and second voltages.

8. The device in claim 7, wherein a difference between said third and fourth voltages is less than the sum of absolute values of threshold voltages of n-type and p-type field effect transistors that comprise said inverter.

9. The device in claim 7, wherein said capacitance comprises:
    said current drawn by said inverter divided by a multiplication result of the frequency of said ring oscillator output multiplied by the difference between said third and fourth voltages; less
    a capacitance constant for said structure.

10. The device in claim 9, wherein said capacitance constant is for said on-chip test device alone and does not include any part of said capacitance of said device under test.

11. The device in claim 7, wherein said measurement of capacitance of said device under test is used to determine the thickness of a gate oxide.

12. The device in claim 7, wherein said device under test comprises one of a gate oxide capacitor, a gate conductor, a channel, and an interconnect.

13. A semiconductor structure formed on a substrate comprising:
    a ring oscillator receiving a first voltage and a second voltage as power supplies, wherein said ring oscillator outputs a ring oscillator output; and
    a plurality of inverters receiving said ring oscillator output as an input, each inverter being coupled to a different terminal of a multi-terminal device under test, wherein said inverters receive a third voltage and a fourth voltage as power supplies,
    wherein current drawn a first inverter of said inverters provides a measurement of capacitance of a first terminal of said multi-terminal device under test while remaining ones of said inverters isolate current drawn by said first inverter to only that associated with said first terminal, wherein a difference between said third and fourth voltages is less than or equal to approximately one-third of the difference between said first and second voltages.

14. The structure in claim 13, wherein a difference between said third and fourth is less than the sum of absolute values of threshold voltages of n-type and p-type field effect transistors that comprise said inverter.

15. The structure in claim 13, wherein said capacitance comprises:
   said current drawn by said inverter divided by a multiplication result of the frequency of said ring oscillator output multiplied by the difference between said third and fourth voltages; less
   a capacitance constant for said structure.

16. The structure in claim 15, wherein said capacitance constant is for said semiconductor structure alone and does not include any part of said capacitance of said device under test.

17. The structure in claim 13, wherein said measurement of capacitance of said device under test is used to determine the thickness of a gate oxide.

18. The structure in claim 13, wherein said device under test comprises one of a gate oxide capacitor, a gate conductor, a channel, and an interconnect.

19. A method of testing the capacitance of a device under test in an integrated circuit chip, said method comprising:
   supplying an output of a ring oscillator to an inverter to produce an inverted ring oscillator output, wherein said inverter receives different voltages as power supplies; and
   inputting said inverted ring oscillator output to said device under test,
   determining current drawn by said inverter to provide a measurement of capacitance of said device under test, wherein said difference between said voltages is less than or equal to approximately one-third of the difference between a second set of voltages provided to said ring oscillator.

20. The method in claim 19, wherein said difference between said voltages is less than the sum of absolute values of threshold voltages of n-type and p-type field effect transistors that comprise said inverter.

21. The method in claim 19, further comprising calculating said capacitance by:
   multiplying the frequency of said ring oscillator output by the difference between said voltages to produce a first result;
   dividing said current drawn by said inverter by said first result to produce a second result; and
   subtracting a capacitance constant for a testing device from said second result.

22. The method in claim 19, wherein said capacitance constant is for said testing device alone and does not include any part of said capacitance of said device under test.

23. The method in claim 19, wherein said device under test comprises a gate oxide capacitor.

24. The method in claim 23, wherein said measurement of capacitance of said device under test is used to determine the thickness of said gate oxide capacitor.

25. The method in claim 19, wherein said device under test comprises one of a gate conductor, a channel, and an interconnect.

* * * * *